United States Patent
Wall

(10) Patent No.: US 10,591,727 B2
(45) Date of Patent: Mar. 17, 2020

(54) COVER SYSTEM AND HOUSING WITH SAID COVER SYSTEM

(71) Applicant: AUDI AG, Ingolstadt (DE)

(72) Inventor: Christian Wall, Hitzhofen (DE)

(73) Assignee: AUDI AG, Ingolstadt (DE)

( * ) Notice: Subject to any disclaimer, the term of this patent is extended or adjusted under 35 U.S.C. 154(b) by 153 days.

(21) Appl. No.: 15/563,373

(22) PCT Filed: Sep. 30, 2016

(86) PCT No.: PCT/EP2016/073469
§ 371 (c)(1),
(2) Date: Sep. 29, 2017

(87) PCT Pub. No.: WO2017/063903
PCT Pub. Date: Apr. 20, 2017

(65) Prior Publication Data
US 2018/0088331 A1    Mar. 29, 2018

(30) Foreign Application Priority Data
Oct. 14, 2015 (DE) ........................ 10 2015 013 340

(51) Int. Cl.
*G02B 27/01* (2006.01)
*B60K 35/00* (2006.01)
*B60K 37/04* (2006.01)
*B60R 11/00* (2006.01)
*G02B 27/00* (2006.01)
*H05K 5/03* (2006.01)

(52) U.S. Cl.
CPC .......... *G02B 27/0149* (2013.01); *B60K 35/00* (2013.01); *B60K 37/04* (2013.01);
(Continued)

(58) Field of Classification Search
CPC ............ G02B 27/0149; G02B 27/0006; G02B 27/0101; G02B 2027/0154; H05K 5/03;
(Continued)

(56) References Cited

U.S. PATENT DOCUMENTS 6,012,785 A * 1/2000 Kawasaki .............. B60K 37/00
312/29
6,504,518 B1 * 1/2003 Kuwayama ............ G02B 27/01
345/7
(Continued)

FOREIGN PATENT DOCUMENTS

DE        102 20 180 A1    11/2002
DE    10 2015 013 340.3        10/2015
(Continued)

OTHER PUBLICATIONS

Chinese Office Action dated Jan. 17, 2019, from Chinese Patent Application No. 201680017416.1, with English language translation of summary of Examiner's comments (10 pages total).
(Continued)

*Primary Examiner* — Jade R Chwasz
(74) *Attorney, Agent, or Firm* — Staas & Halsey LLP

(57) ABSTRACT

A first cover part and a second cover part of a cover system adjoin one another in a first state and together form a closed surface with four corner regions. In a second state, the first edge of the first cover part is movable in a definable direction through a first definable angle about an axis which extends parallel to an imaginary straight line through the ends of the first edge of the first cover part, the first edge of the second cover part is movable in the definable direction through a second definable angle about an axis which extends parallel to an imaginary straight line through the ends of the first edge of the second cover part, and the first edge of the second cover part is movable in a definable direction by a definable distance. A housing can include the cover system.

19 Claims, 4 Drawing Sheets

(52) U.S. Cl.
CPC .......... *B60R 11/00* (2013.01); *G02B 27/0006* (2013.01); *G02B 27/0101* (2013.01); *H05K 5/03* (2013.01); *B60K 2370/155* (2019.05); *B60K 2370/1529* (2019.05); *B60K 2370/331* (2019.05); *B60K 2370/334* (2019.05); *B60K 2370/66* (2019.05); *B60K 2370/67* (2019.05); *B60R 2011/0082* (2013.01); *B60R 2011/0094* (2013.01); *G02B 2027/0154* (2013.01)

(58) Field of Classification Search
CPC ............. B60R 11/00; B60R 2011/0094; B60R 2011/0082; B60K 37/04; B60K 35/00; B60K 2350/1072; B60K 2350/2034; B60K 2350/2052; B60K 2350/405
USPC .......................................................... 359/507
See application file for complete search history.

(56) References Cited

U.S. PATENT DOCUMENTS

| | | | | |
|---|---|---|---|---|
| 6,657,789 | B2* | 12/2003 | Nakamura | G02B 27/0149 359/632 |
| 6,837,581 | B1 | 1/2005 | Raines et al. | |
| 7,623,294 | B2* | 11/2009 | Harada | G02B 27/01 359/13 |
| 7,643,215 | B2* | 1/2010 | Shin | G02B 27/0101 340/438 |
| 2008/0285138 | A1 | 11/2008 | Lebreton | |
| 2010/0046082 | A1* | 2/2010 | Croy | B60K 35/00 359/632 |

FOREIGN PATENT DOCUMENTS

| | | |
|---|---|---|
| JP | 2006-65092 | 3/2006 |
| WO | 2012/169557 A1 | 12/2012 |
| WO | PCT/EP2016/073469 | 9/2016 |

OTHER PUBLICATIONS

International Search Report dated Feb. 1, 2017 from International Patent Application No. PCT/EP2016/073469, 2 pages.
Translation of International Preliminary Report on Patentability dated Apr. 26, 2018 from International Patent Application No. PCT/EP2016/073469, 7 pages.
Chinese Office Action dated Jul. 25, 2019, from Chinese Patent Application No. 201680017416.1, with English language translation of summary of Examiner's comments (11 pages total).

\* cited by examiner

COVER SYSTEM AND HOUSING WITH SAID COVER SYSTEM

CROSS REFERENCE TO RELATED APPLICATIONS

This application is a U.S. national stage of International Application No. PCT/EP2016/073469, filed on Sep. 30, 2016. The International Application claims the priority benefit of German Application No. 10 2015 013 340.3 filed on Oct. 14, 2015. Both the International and the German application are incorporated by reference herein in their entirety.

BACKGROUND

Described herein are a cover system for opening and closing a side of a housing which accommodates an imaging device and an optical unit for a head-up display, and a housing which accommodates an imaging device and an optical unit for a head-up display and including the cover system.

In order to be able to display information in the form of text, graphics, virtual images etc. to drivers of motor vehicles in a convenient manner that provides as little distraction from the road as possible and without any or significant adjustment of the viewing distance for the eyes (accommodation), it has been known for some time to provide one or more head-up displays in motor vehicles.

As is known, in head-up displays, light from an imaging device, for instance on the basis of a liquid crystal display, is projected onto a light-transmissive reflective surface. The reflective surface, which can be, for example, a part of the windshield of a motor vehicle or an optionally kinematically retractable and extendable "combiner plate", as it is known, is often arranged, in motor vehicles, behind the steering wheel of the motor vehicle in the direction of the front of the vehicle.

In order to realize as little installation space as possible, in head-up displays, an optical unit is often provided, with which the beam path of the light emitted by the imaging device can be deflected or "bent" in the direction of the reflective surface. Such head-up displays are of interest especially for apparatuses, for instance motor vehicles, in which only very little installation space is available.

In motor vehicles, the integration of the imaging device, which can optionally have a separate light source, and an optical unit represents a particular challenge.

Specifically, not only is it desirable to integrate the elements of a head-up display entirely in the interior of the instrument panel or dashboard of a motor vehicle, it is also desirable to provide a "closure system", with which, in the switched-off state of the head-up display, the imaging device and the optical unit can be largely closed off from the environment, in order to keep soiling of these devices as low as possible. In this case, it is desirable for such a closure system, in the closed state, also to terminate as flush as possible with the surfaces surrounding the closure system.

For the problems outlined above, solutions are known from the related art. However, these are very complicated with regard to the kinematics, require a relatively large amount of installation space, which is often simply not available in the region of the instrument panel or dashboard of a motor vehicle, or do not allow a "bent" beam path of the light.

Thus, for instance, U.S. Patent Application Publication 2008/0285138 A1 describes a display apparatus for a motor vehicle, which has a light source for generating displayable information and an at least partially transparent, retractable plate which reflects the information in the direction of a user of the motor vehicle, wherein the plate is fastened to a movable holder which is movable between a rest position and at least one display position, and wherein the plate is in a retracted state when the movable holder is in the rest position and the plate is in an extended state when the movable holder is in a display position. A housing having two flaps can be provided, with which the movable holder, the plate and the light source are completely enclosed when the plate is in the retracted state.

SUMMARY

Described herein is a novel cover system and a novel housing having the cover system, it being possible for drawbacks of the related art to be overcome or at least reduced with the cover system and housing.

Described herein is a cover system for opening and closing a side of a housing which is intended to receive or accommodate an imaging device and an optical unit for a head-up display. The cover system may include at least one first cover part and a second cover part, and the first cover part and the second cover part adjoin one another in a first state and together form a closed surface with four corner regions.

The cover system—may have a first edge of the first cover part that forms an outer edge of the closed surface, and the ends of the first edge of the first cover part may immediately adjoin two first adjacent corner regions of the closed surface, a first edge of the second cover part that forms at least a part of a further outer edge of the closed surface, and the ends of the first edge of the second cover part either immediately adjoin two second adjacent corner regions of the closed surface that are different than the two first adjacent corner regions, or are arranged at the edge of the closed surface which extends between the two second adjacent corner regions of the closed surface, And, in order to form a second state, the first edge of the first cover part may be movable in a definable direction through a first definable angle about an axis which extends parallel to an imaginary straight line through the ends of the first edge of the first cover part, the first edge of the second cover part may be movable in the definable direction through a second definable angle about an axis which extends parallel to an imaginary straight line through the ends of the first edge of the second cover part, and the first edge of the second cover part may be movable in a definable direction by a definable distance relative to the surface which is defined by an imaginary rectilinear connection of the four corner regions of the closed surface.

The cover system described herein provides a number of advantages over the solutions known from the related art.

The cover system described herein for the one part allows a cost-effective dual use of the cover system both for covering an imaging device and an optical unit of a head-up display (for closing them off from the environment), and for shaping the light channel, i.e. for freeing up the beam path for the light emitted by the imaging device, and the light, which is deflected toward a reflective surface by the optical unit.

Furthermore, the cover system described herein requires only simple kinematics, and is cost-effective to realize, for opening and closing the cover system.

Thus, by use of the cover system described herein, in contrast to previously known solutions, a very small installation space, which is provided for the imaging device and the optical unit of a head-up display, can be realized. This also results in a very small installation space for instance for a complete combiner head-up display. A small installation space, i.e. a small volume of a corresponding housing in the open state, produces the further advantage that the possible introduction and deposition of contaminants on the imaging device and the optical unit during operation of a head-up display can also be kept low.

According to a first advantageous development of the cover system, in the case of the closed surface formed by the first and the second cover part in the first state, the length of the edge between the two first corner regions of the closed surface is greater than the length of the edge between the two second corner regions of the closed surface.

Further advantages are produced when, as is provided according to a second advantageous development of the cover system, the second cover part has a surface with four corner regions, the ends of the first edge of the second cover part correspond to two first adjacent corner regions of the second cover part, the ends of a second edge of the second cover part correspond to two second adjacent corner regions of the second cover part that are different than the two first adjacent corner regions of the second cover part, and the first edge has a greater length than the second edge.

According to yet a further advantageous development of the cover system, the first cover part has at least one second edge which is aligned with the edge of the closed surface, which extends between the second two adjacent corner regions of the closed surface, and the first cover part, in the region of its at least one second edge, and the second cover part, in the region of its first edge, are connected together so as to be rotatable about the axis, which extends parallel to an imaginary straight line through the ends of the first edge of the second cover part, with respect to one another.

Furthermore, in the cover system described herein, it is advantageously described herein for one or both edge(s) of the first cover part that is/are immediately adjacent to the first edge thereof to be connected to a border for the cover system by using a flexible element, and/or one or both edge(s) of the second cover part that is/are immediately adjacent to the first edge thereof to be connected to the first cover part by using a flexible element.

According to yet another advantageous development of the cover system, it is described herein for a wiper (for wiping off contaminants from the surface of an imaging device and/or an optical unit) to be arranged at the first edge and/or at the second edge of the second cover part.

Also described herein is a housing which is intended to receive an imaging device and an optical unit for a head-up display. The housing may include a cover system as described herein or one of the advantageous developments thereof.

According to a first advantageous development of the housing, the latter can have an electromotive, electropneumatic, electrohydraulic and/or spring device for moving the first cover part and/or the second cover part from the first state to the second state and/or from the second state to the first state.

Furthermore, it is advantageously described herein for the housing to have a retaining device for releasably retaining the first and/or second cover part in the first and/or second state, and/or at least one end-stop element for the first and/or second cover part.

According to yet further advantageous developments, it is described herein for the housing to be connected to a combiner device with a combiner plate, or to have a combiner plate, to have an imaging device which has liquid crystals, light emitting diodes, organic light emitting diodes, an electroluminescent device, a field emission device, a micromirror array and/or a cathode ray tube, and/or to have an optical unit which has at least one mirror for projecting the light emitted by the imaging device to a reflective surface.

BRIEF DESCRIPTION OF THE DRAWINGS

These and other aspects and advantages will become more apparent and more readily appreciated from the following description of the exemplary embodiments, taken in conjunction with the accompanying drawings, of which.

DETAILED DESCRIPTION OF THE PREFERRED EMBODIMENT

Figure 1:
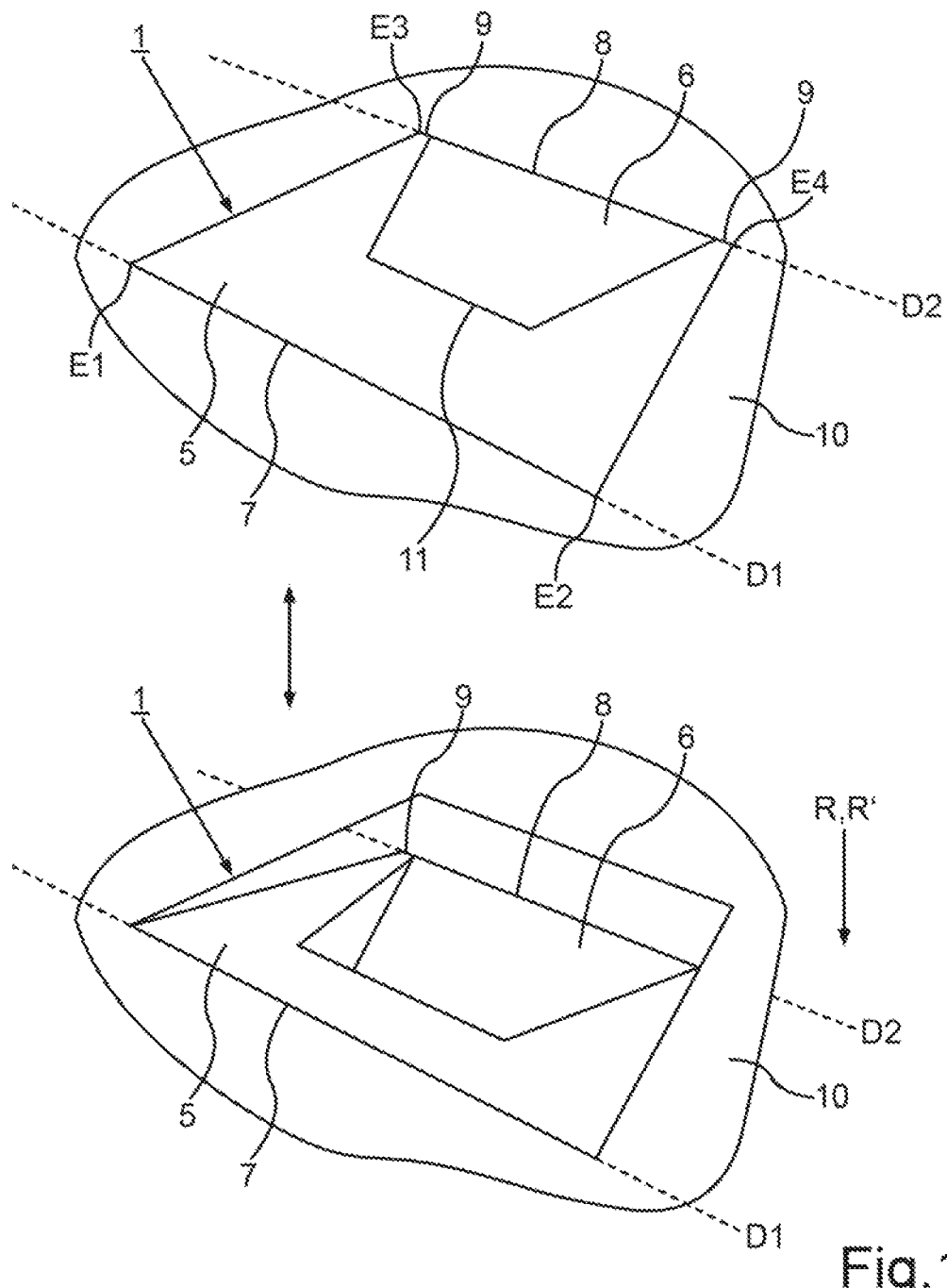
FIG. 1 is a schematic illustration of an exemplary cover system as described herein in a first, closed state and in a second, open state.

Reference will now be made in detail to the preferred embodiments, examples of which are illustrated in the accompanying drawings, wherein like reference numerals refer to like elements throughout.

The illustrations in the drawing are purely schematic and not to scale. Within the drawings, identical or similar elements are provided with the same reference signs.

The exemplary embodiments explained below represent preferred embodiments of the disclosure. The disclosure is, of course, not limited to these embodiments.

The features and combinations of features mentioned in the above description and the features and combinations of features mentioned in the following description of embodiments, exemplary embodiments and the description of the drawings and/or shown on their own in the drawings are usable not only in the respectively given combination but also in other combinations or on their own without departing from the scope of the disclosure.

FIGS. 1 to 5 and the following statements deal primarily with a cover system 1 in which the first 5 and the second 6 cover part take up a trapezoidal or approximately trapezoidal surface in a closed state. The disclosure is, of course, not limited to the configuration of the cover system 1 that is illustrated in these drawings and explained in the associated description.

It is part of the disclosure and apparent to a person skilled in the art that, in order to achieve the advantages according to the disclosure, the cover system 1 can also have, for example, a rectangular shape in the first state, that, for example, the first 5 and the second 6 cover part can have equally long first edges 7, 8, that, for example, the first 5 and the second 6 cover part can each have a rectangular shape, that, for example, the size ratios between the first 5 and the second 6 cover part can be varied (the second cover part 6 can, for example, be as large as or larger than the first cover part 5), that, for example, the edges of the first 5 and second 6 cover part do not have to extend in a rectilinear manner, etc.

Thus, it is possible, for example, for edges of the first 5 and second 6 cover part also to have a curved shape such that at least some of the abovementioned corner regions E1, E2, E3, E4 and corner regions of the second cover part 6 are no longer discernible as such (even if, in such a case, they are still defined or able to be defined). A schematic example of such a cover system 1 is illustrated in its first, closed state in FIG. 6.

Figure 6:
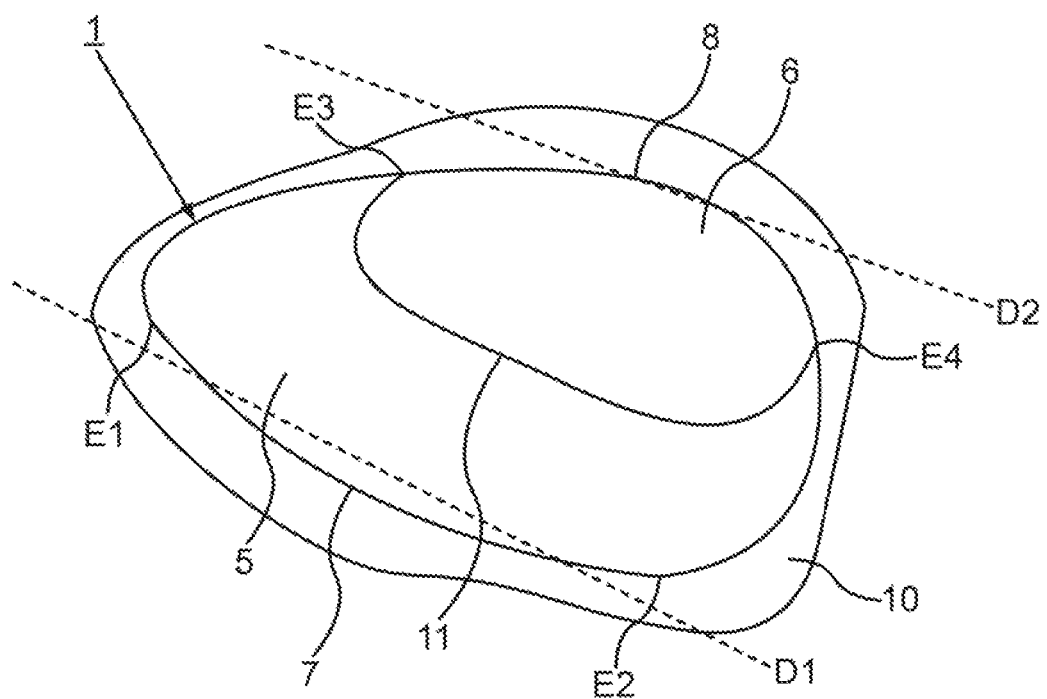
FIG. 6 is a schematic illustration of a further example of the cover system as described herein.

The corner regions E1, E2, E3, E4 and the corner regions of the second cover part 6 can, in a simple case, be corner points, but it is also possible for the corner regions (as indicated for instance in FIGS. 2 to 4) to have rounded corners (wherein, in such a case, for example, the surface which is defined by the corner regions E1, E2, E3, E4, can be defined for instance by an imaginary connection of the center of the rounded corners by straight lines), or the corner regions E1, E2, E3, E4 and/or the corner regions of the second cover part 6 can be suitably defined points (cf. the example shown in FIG. 6).

In the case of the cover systems 1 illustrated by way of example and schematically in the drawings, the cover system 1 is illustrated together with a border 10, merely to illustrate embodiments of the cover system and housing more clearly. However, such a border 10 represents at most an optional, further element of the cover system 1 or of the housing 2.

As illustrated in the upper region of FIG. 1, the cover system 1 described herein has at least one first cover part 5 and a second cover part 6, and the first cover part 5 and the second cover part 6 adjoin one another in a first (closed) state and together form a closed surface with four corner regions E1, E2, E3, E4.

The cover system 1—described herein further includes a first edge 7 of the first cover part 5 that forms an outer edge of the closed surface, wherein the ends of the first edge 7 of the first cover part 5 immediately adjoin two first adjacent corner regions E1, E2 of the closed surface, and a first edge 8 of the second cover part 6 that forms at least a part of a further outer edge of the closed surface, wherein the ends of the first edge 8 of the second cover part 6 either immediately adjoin two second adjacent corner regions E3, E4 of the closed surface that are different than the two first adjacent corner regions E1, E2, or are arranged at the edge of the closed surface which extends between the two second adjacent corner regions E3, E4 of the closed surface.

And, in order to form a second (open) state, the first edge 7 of the first cover part 5 is movable in a definable direction R through a first definable angle about an axis D1 which extends parallel to an imaginary straight line through the ends of the first edge 7 of the first cover part 5, the first edge 8 of the second cover part 6 is movable in the definable direction R through a second definable angle about an axis D2 which extends parallel to an imaginary straight line through the ends of the first edge 8 of the second cover part 6, and the first edge 8 of the second cover part 6 is movable in a definable direction R' by a definable distance relative to the surface which is defined by an imaginary rectilinear connection of the four corner regions E1, E2, E3, E4 of the closed surface.

Figure 3:
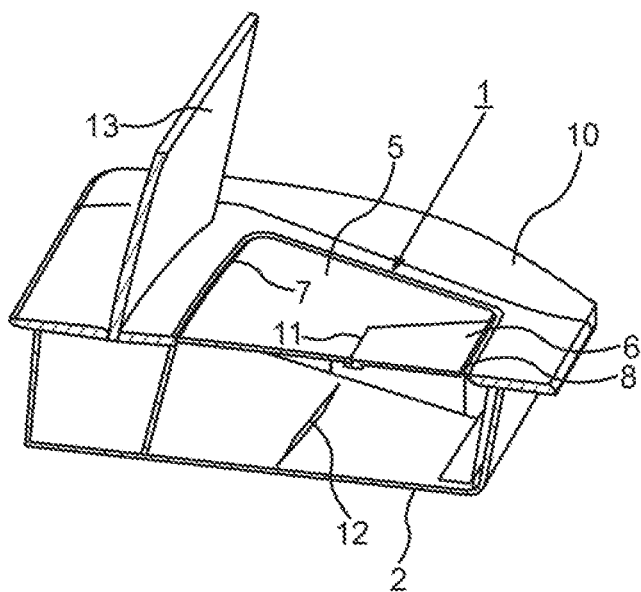
FIG. 3 is a schematic sectional view of the exemplary housing according to FIG. 2.

Where, as described herein, a first cover part 5 and a second cover part 6 are said to "adjoin one another", this should also be understood as including that these parts can overlap in at least a part of their peripheral regions, as is illustrated by way of example in FIG. 3 with regard to the edge 11 of the second cover part 6 with respect to the "adjoining" edge of the first cover part 5.

If the first cover part 5 and the second cover part 6 are moved from the first, i.e. closed state, illustrated in the upper region of FIG. 1, into the second, i.e. open state, as described above, an open state of the cover system 1 is produced for example, as is depicted in the lower region of FIG. 1.

The double arrow depicted in FIG. 1 is intended to symbolize the possible movement of the first 5 and second 6 cover part from the first state to the second and from the second state to the first.

The position of the axis D1 is not particularly limited, but will advantageously extend either through the ends of the first edge 7 of the first cover part 5 or, for example, in the case of an outwardly (convexly) curved first edge 7 (cf. FIG. 6) in the region starting from the ends of the first edge 7 and the apex of the first edge 7 of the first cover part 5.

If, in the first, closed state, the cover system 1 terminates flush or virtually flush with the surface of a border 10 surrounding the cover system 1, it is possible in this way for only a small region, if any, of the first cover part 5 to project over a given border 10 in the event of a movement of the first cover part 5 about the axis D1 in the direction R.

Similar considerations also apply for the axis D2. As already mentioned above, the first edge 8 of the second cover part 6 is moved through a second definable angle in the definable direction R in order to form a second (open) state, and the first edge 8 of the second cover part 6 is moved in the definable direction R' by a definable distance relative to the surface which is defined by an imaginary rectilinear connection of the corner regions E1, E2, E3, E4 (in each case one straight line from E1 to E2, from E2 to E3, from E3 to E4 and from E4 to E1) of the closed surface.

In order in this case to free up the entire definable distance or at least a large proportion thereof between the first edge 8 and a border 10, it is advantageous for the second axis D2 either to extend through the ends of the first edge 8 of the second cover part 6, or, for example, in the case of an outwardly (convexly) curved first edge 8 (cf. FIG. 6) in the region starting from the ends of the first edge 8 and the apex of the first edge 8 of the second cover part 6.

The size of the first and the second angle is also not particularly limited. The first and the second angle can be the same size or be different from one another. The first and the second angle will be selected by a person skilled in the art depending on the respective requirements and conditions, and the first and second angles can, independently of one another, have for example a value in the range from 5° to 60°, wherein any value located in between within the specified range is expressly part of the subject matter of the disclosure (i.e., it is possible for example for 5°, 6°, 7°, 8°, 9°, 10°, 11°, 12°, 13°, 14°, 15°, 16°, 17°, 18°, 19°, 20°, 21°, 22°, 23°, 24°, 25°, 26°, 27°, 28°, 29°, 30°, 31°, 32°, 33°, 34°, 35°, 36°, 37°, 38°, 39°, 40°, 41°, 42°, 43°, 44°, 45°, 46°, 47°, 48°, 49°, 50°, 51°, 52°, 53°, 54°, 55°, 56°, 57°, 58°, 59° or 60° to be specified independently of one another as values for the first and the second angle, wherein angles between the integer values, which differ from the integer values for instance by 0.1°, 0.2°, 0.3°, 0.4°, 0.5°, 0.6°, 0.7°, 0.8° or 0.9°, are likewise included by the disclosure).

The first and/or second definable angle can be variable independently of one another (for instance for readjustment), in other words do not have to be fixed in advance for one and the same application.

The length of the definable distance, by which first edge 8 of the second cover part 6 can be moved in a definable direction R' in order to form a second state, or back in order to form the first state, is not particularly limited, either, and will be chosen by a person skilled in the art depending on the respective requirements and conditions. If the cover system 1 described herein is intended for example for a head-up display in a motor vehicle, a range from 1 cm to 20 cm, for example, can be defined as the distance, wherein any value located in between within the specified range is expressly part of the subject matter of the disclosure (i.e., it is possible for example for 1 cm, 2 cm, 3 cm, 4 cm, 5 cm, 6 cm, 7 cm, 8 cm, 9 cm, 10 cm, 11 cm, 12 cm, 13 cm, 14 cm, 15 cm, 16 cm, 17 cm, 18 cm, 19 cm or 20 cm to be specified as values for the distance, wherein a distance between the integer values, which differs from the integer values for instance by 0.1 cm, 0.2 cm, 0.3 cm, 0.4 cm, 0.5 cm, 0.6 cm, 0.7 cm, 0.8 cm or 0.9 cm, is likewise included by the disclosure). It is also possible for the definable distance to be variable (for instance for readjustment reasons).

With regard to the directions R, R', too, there are no particular limitations, and the directions R, R' will be chosen by a person skilled in the art depending on the respective requirements and conditions. The directions R, R' are symbolized by a single straight arrow in the lower region of FIG. 1, merely for the sake of simplicity.

Since the first edge 7 of the first cover part 5 is movable about the axis D1 and the first edge 8 of the second cover part 6 is movable about the axis D2, the direction R does not strictly speaking extend in a rectilinear manner with respect to these edges but along a circular path.

Figure 2:
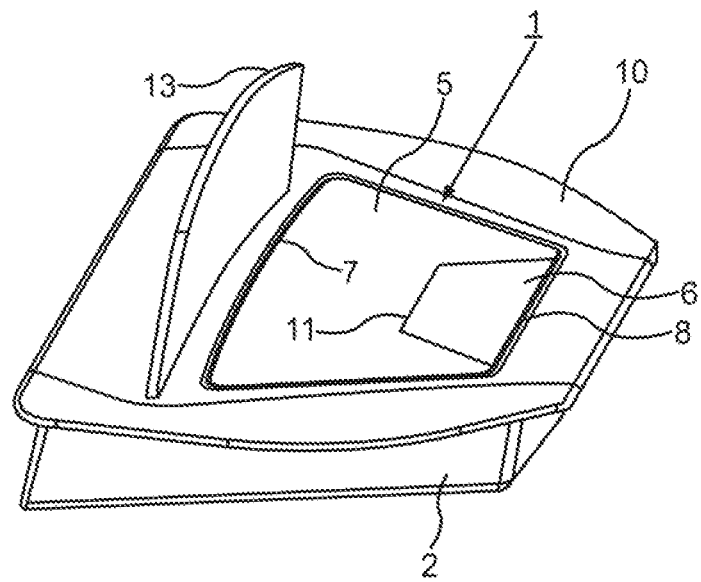
FIG. 2 is a schematic illustration of an exemplary housing with a cover system as described herein in the closed state, wherein, for the sake of clarity, the housing is illustrated as a component of a head-up display device with a combiner plate.

The direction R', in which the first edge 8 of the second cover part 6 is moved, can have either a rectilinear course or a course along a circular path. The latter course arises for example when, as indicated in FIG. 2, the first cover part 5 is connected to a border 10, and the first cover part 5 and the second cover part 6 are connected together so as to be rotatable with respect to one another.

Therefore, it is apparent for a person skilled in the art that, strictly speaking, the direction R is a direction along a circular path and the direction R' is either a "straight" direction or one along a circular path. Where the directions R and/or R' are ones along a circular path, the direction arrow indicated in FIG. 1 therefore symbolizes merely the direction of the movement(s) at the start of the transition from the first state to the second.

As can be gathered from FIG. 1 (and indirectly also from FIG. 4), the (initial) directions R, R' are directed away from the surface defined by the corner regions E1, E2, E3, E4, and, when the cover system 1 is used to open and close a side of a housing 2, for example, in the direction of the interior of the housing 2 (cf. FIGS. 2 to 5). The surface defined by the corner regions E1, E2, E3, E4 can be a flat surface in a simple case.

The cover system 1 illustrated in FIG. 1 has an example configuration, in that: (1) in the case of the closed surface formed by the first 5 and the second 6 cover part in the first state, the length of the edge between the two first corner regions E1, E2 of the closed surface is greater than the length of the edge between the two second corner regions E3, E4 of the closed surface, (2) the second cover part 6 has a surface with four corner regions, wherein the ends of the first edge 8 of the second cover part 6 correspond to two first adjacent corner regions of the second cover part 6, and the ends of a second edge 11 of the second cover part 6 correspond to two second adjacent corner regions of the second cover part 6 that are different than the two first adjacent corner regions of the second cover part 6, and wherein the first edge 8 has a greater length than the second edge 11, and (3) the first cover part 5 has at least one second edge 9 which is aligned with the edge of the closed surface, which extends between the second two adjacent corner regions E3, E4 of the closed surface, and the first cover part 5, in the region of its at least one second edge 9, and the second cover part 6, in the region of its first edge 8, are connected together so as to be rotatable about the axis D2 with respect to one another.

A configuration of the cover system 1 according to items (1) and (2) above follows the widening of the beam path 14 of the light emitted by an imaging device 3 and deflected by an optical unit 4 in a head-up display (cf. FIGS. 2 to 5).

And a configuration of the cover system 1 according to item (3) above is advantageous in particular with regard to particularly simple kinematics for opening and closing the cover system 1 (moving the cover system 1 from a first state to a second and from a second state to a first). On account of the connection between the first cover part 5 in the region of its at least one second edge 9 and the second cover part 6 in the region of its first edge 8, and the mutual rotatability of the two cover parts 5, 6 about the axis D2, it is sufficient, in order to form a second state of the cover system 1, for the second edge 11 of the second cover part 6 to be moved (on the basis of the drawing in FIG. 1) in the direction beneath the plane of the drawing. On account of the connection of the two cover parts 5 and 6, a movement of the first edge 7 of the first cover part 5 in the defined direction R through a first definable angle about the axis D1 also inevitably takes place, the first edge 8 of the second cover part 6 is moved in the definable direction R through a second definable angle about the axis D2, and the first edge 8 of the second cover part 6 is moved by a definable distance in the definable direction R' relative to the surface which is defined by the four corner regions E1, E2, E3, E4 of the closed surface.

In this case, but also generally, it is necessary for the position of the first edge 6 of the first cover part 5 to be fixed. Such fixing can be provided for example at a border 10 or at an upper edge of a wall of the housing 2.

A configuration of the cover system 1 according to item (3) above, however, is only an optional configuration and it is, of course, possible for the first cover part 5 and the second cover part 6 to be independent one of one another and thus also to be movable completely independently of one another.

Figure 5:
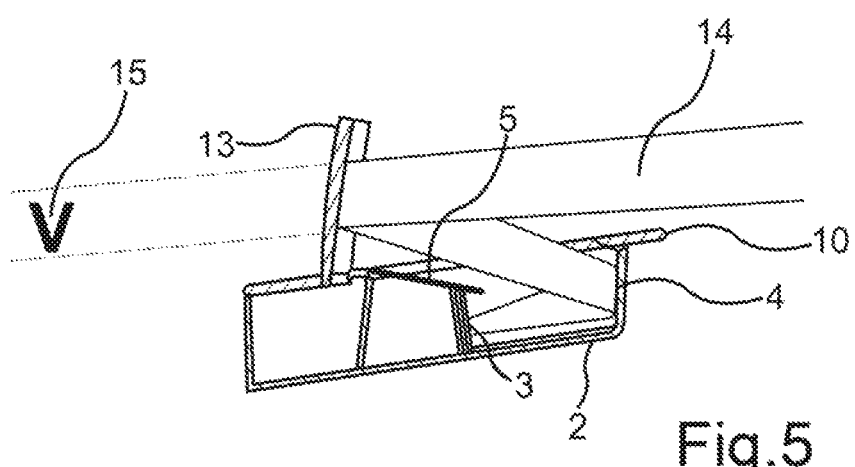
FIG. 5 is a schematic sectional view of an exemplary housing as described herein with a likewise merely schematic and exemplary illustration of a possible course of the beam path of light emitted by an imaging device and deflected by an optical unit in the direction of a combiner plate.

As can be gathered from FIG. 5, by way of the cover system 1 described herein, it is possible, in a technically simple manner, to realize a very compact housing 2 for an imaging device 3 and an optical unit 4 for a head-up display, in which a "bent" beam path 14 for the light emitted by the imaging device 3 is used.

To this end, an optical unit 4 can be used which, in its simplest embodiment (for example for a combiner head-up display) merely has a (planar or aspherical) mirror (folding mirror) for deflecting and projecting the light emitted by the imaging device 3 to a reflective surface 13.

Since, in spite of the extremely advantageous configurations of the cover system 1 and of the housing 2 described herein, it is not possible to rule out for example dust-form contaminants from settling on an imaging device 3 and/or optical unit 4 arranged in the housing 2, the contaminants penetrating into the housing 2 during the second, open state of the cover system 1, provision can advantageously be made for a wiper to be arranged at the first edge 8 and/or at the second edge 11 of the second cover part 6 in the cover system 1. Such a wiper can include for instance a brush form with suitable natural and/or plastics fibers or a cloth-type form, for instance made of an electrostatically chargeable material.

When such a wiper is suitably arranged at the first edge 8 and/or at the second edge 11 of the second cover part 6, and the second cover part 6, the imaging device 3 and/or the optical unit 4 are arranged in a suitable manner with respect to one another, it is possible, both when the second cover part 6 is moved from a first, closed state to a second, open state and when the second cover part 6 is moved from a second, open state to a first, closed state, for the wiper to brush over the surface of the imaging device 3 and/or optical unit 4 and thus to remove contaminants from this device 3 and/or unit 4.

The reflective surface illustrated in FIGS. 2 to 5 is what is known as a combiner plate 13 with which comparatively inexpensive combiner head-up displays (cHUDs) can be realized compared with head-up displays, in which the light emitted by the imaging device 3 is projected onto a freeform surface, for instance a windshield of a motor vehicle.

This is because, in the case of a windshield head-up display, the windshield is integrated into the optical path, this requiring only low tolerances and high precision for the optical unit 4 and in particular for the mirror used therein, on account of the freeform surface shape of the windshield. By contrast, in the case of a combiner head-up display, a combiner plate 13 that is optimized in terms of its optical properties is introduced into the optical path, the combiner plate having a comparatively simple curvature compared with a freeform surface, resulting in less stringent requirements for the precision of the optical unit 4.

And, in order to set the "eye box" of a combiner head-up display, the combiner plate 13 is usually configured in a pivotable manner. It is necessary to set the "eye box" when a user cannot see, or cannot completely see, the information 15 displayed by the head-up display.

The cover system 1 and the housing 2 having the cover system 1 are not restricted to use in combiner head-up displays but can, of course, also be used for those head-up displays in which the light emitted by the imaging device 3 is emitted onto a freeform surface, for instance in the case of a windshield head-up display. In such a case, it is necessary for the optical unit 4 be set up to emit the light emitted by the imaging device 3 such that the information displayed by the head-up display is visible to a user, i.e. appears within the "eye box". To this end, it can be sufficient to provide a movable (planar or aspherical) mirror in the housing 2. The head-up displays can also be in the form of what are known as "augmented reality" head-up displays.

Of course, the optical unit 4 can have further elements, for instance one or more lenses, with which for instance the function of a collimator is realized.

As can be further gathered from FIG. 5, an optical unit 4 in the form of a mirror (folding mirror) can be provided on a wall of the housing 2, the wall extending parallel to the ends of the first edge 8 of the second housing part 6 and the mirror, where necessary or desirable, being attached to the wall so as to be movable (for example electromotively) about at least one of its axes. And an imaging device 3 can be arranged for example in the region "beneath" the first cover part 5 (as per the orientation shown in the drawings).

A fixed first definable angle through which the first edge 7 of the first cover part 5 can be moved about the axis D1 can be realized easily in that one or both edge(s) of the first cover part 5 that is/are immediately adjacent to the first edge 7 thereof is/are connected to a border 10 for the cover system 1 by using an appropriately configured, flexible element. Such a "flexible element" can be for example a material that itself has flexible properties, for instance a thin plastics material, or in which the flexibility is achieved for example by a joint. The "flexible element" can extend for instance completely along the edge(s) (and, in a manner corresponding thereto, along the border 10) or be fastened only to a portion thereof.

If, in order to form the second state of the cover system 1, the first cover part 5 is moved so far in the direction R that the flexible element is in a "stretched" state, the first cover part 5 cannot be moved any further and thus takes up the position provided for the second state at the defined angle.

Similarly, provision can also be made for one or both edge(s) of the second cover part 6 that is/are immediately adjacent to the first edge 8 thereof to be connected to the first cover part 5 by using a flexible element. The above statements apply mutatis mutandis with regard to the "flexible element".

If the first cover part 5 is connected to a border 10 by using at least one flexible element, and if the second cover part 6 is connected to the first cover part 5 by using at least one flexible element, then the first definable angle for the first cover part 5, the second definable angle for the second cover part 6, and the definable distance by which the first edge 8 of the second cover part 6 can be moved result easily from the configuration of the first 5 and second 6 cover part and from the configuration of the respective flexible elements.

Where "immediately adjacent" edges are referred to above, these should be understood as being edges which are spaced apart from one another at most by a corner region of the respective cover part 5, 6.

Figure 4:
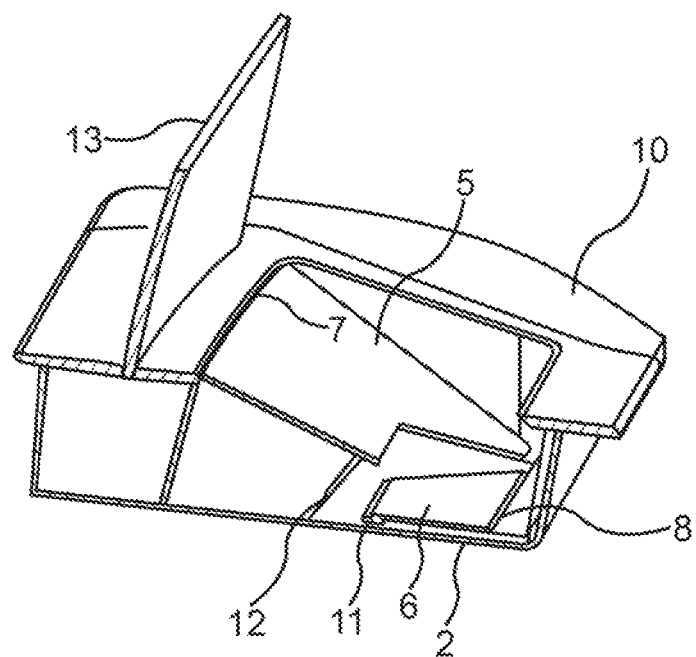
FIG. 4 is a schematic sectional view of the exemplary housing according to FIG. 2 with the cover system as described herein in a second, open state.

However, a definable first definable angle for the first cover part 5, a second definable angle for the second cover part 6 and/or a definable distance of the first edge 8 of the second cover part 6 can alternatively or additionally also be achieved easily by, in each case, at least one end stop element 12, of which only one is illustrated by way of example in FIGS. 3 and 4 for the first cover part 5.

The flexible element(s) or the end stop element(s) 12 should of course be arranged outside the beam path 14.

In order to move the first cover part 5 and/or the second cover part 6 from the first state to the second state and/or from the second state to the first state, and optionally to keep the first cover part 5 and/or the second cover part 6 in the first state and/or in the second state, the housing 2 described herein can have at least one electromotive, electropneumatic, electrohydraulic and/or spring device (not illustrated in the drawings). An electromotive device can include for example a rack or a threaded rod, an electropneumatic or electrohydraulic device can include for example a piston that is movable by a gas or a liquid, and a spring device can include for example a leaf spring or a coil spring.

In order to keep the first 5 and/or second 6 cover part releasably in the first and/or second state, it is also possible for at least one retaining device, for instance in the form of a releasable snap-fitting or latching connection, to be provided at the housing 2.

In a simplest embodiment, it is thus possible for the first cover part 5 and the second cover part 6 of the cover system 1 to be kept in a first, closed state for instance by a spring.

As a result of pressure being applied to the first 5 and/or second 6 cover part, for instance by a finger or a hand of a human, the first cover part 5 and the second cover part 6 can be moved from the first, closed state to the second, open state. The first cover part 5 and the second cover part 6 can be kept in this state by a retaining device, for instance in the form of a releasable snap-fitting or latching connection, until the snap-fitting or latching connection is released again, for instance by pressure being applied again or tension being applied to the first 5 and/or second 6 cover part, and the two cover parts 5, 6 are moved back into the first, closed state by the spring.

In an advanced embodiment, it is possible, when a head-up display that a housing 2 described herein has is switched on, for the first 5 and the second 6 cover part to be moved from a first, closed state to a second, open state for instance by an electromotive, electropneumatic or electrohydraulic device, and to be kept in this state for as long as the head-up display is activated. When the head-up display is switched off, the first 5 and the second 6 cover part can then be moved back from the second, open state to the first, closed state by using the electromotive, electropneumatic or electrohydraulic device.

With regard to the material of the cover system 1 and of the first 5 and second 6 cover part used therein (and further possible cover parts), there are no particular limitations. For a head-up display in a motor vehicle, however, it is advantageous for the material to have a high absorption capacity for light, for example a matt, structured surface and/or a surface provided with an anti-reflective coating, in order that the cover system 1 is visible as little as possible, if at all, in the reflective surface 13. Corresponding considerations apply for the material for the above-described flexible element(s), for the end stop element(s) 12 and for the material of the inner side of the housing 2.

The material of the cover system 1 can be identical to or different than the material of a border 10 for the cover system 1. The border 10 for the cover system 1 can for example be a part of the instrument panel or dashboard of a motor vehicle, a constituent part of the housing 2, etc.

Where the term "combiner device" is used in the disclosure, this should be understood as including a device which is at least set up to hold, in a pivotable manner, a combiner plate 13 for setting the "eye box" of a combiner head-up display. The combiner device can include a correspondingly set-up housing.

In summary, more and more motor vehicles are being equipped with head-up display systems. A cost-effective variant of such head-up display systems is represented by what is known as a combiner head-up display (cHUD) with a combiner plate. The integration thereof into an instrument panel or dashboard in the region of the cowl represents a particular challenge. In the "OFF" operating state, the cHUD and the optical elements thereof (imaging device and optical unit) are intended to be largely closed by a cover, in order to keep contamination of these elements as low as possible.

Known cover solutions are generally very complicated as far as the kinematics are concerned and require a large amount of additional installation space.

Therefore, according to the disclosure, a cover system 1 is disclosed which, in the closed state, covers the optical system in a manner flush with the surface (for example flush with the cowl in a streamlined manner). In the open state, the optical path is formed from the individual elements of the cover and frees up the light channel of the head-up display system. The disclosed cover system 1 and the disclosed housing 2 are suitable in particular for cHUDs, but the disclosed cover system 1 and the disclosed housing 2 are not limited thereto. Thus, the disclosed cover system 1 and the disclosed housing 2 can also be used for instance in all other kinds of head-up displays.

The disclosed cover system 1 allows a cost-effective dual use of the cover system 1 for covering and light-channel shaping, requires only simple kinematics, allows the use of a bent beam path 14 that is optimized for installation space, allows a housing 2 with only a small open volume, with the result that introduction of contaminants into the housing 2 in an open state of the cover system 1 can be kept low, requires no intervention in and no movement of the optical system 3, 4 of a head-up display, and reduces light reflection by the cover system 1 to a minimum, since the opening freed up by the cover system 1 is able to be limited to the region of the beam path 14.

Even though the cover system 1 and the housing 2 have mainly been described in connection with motor vehicles, the scope of protection of the following claims is of course not limited to the use or integration of the cover system 1 and the housing 2 in motor vehicles.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A cover system for opening and closing a side of a housing which accommodates an imaging device and an optical unit for a head-up display, the cover system comprising:
    a first cover part; and
    a second cover part,
    the first cover part and the second cover part are configured to adjoin one another in a first state so as to form a closed surface of the housing with four corner regions, such that a first edge of the first cover part forms an outer edge of the closed surface, and ends of the first edge of the first cover part immediately adjoin two first adjacent corner regions among the four corner regions of the closed surface,
    a first edge of the second cover part forms at least a part of a further outer edge of the closed surface, ends of the first edge of the second cover part either immediately adjoin two second adjacent corner regions among the four corner regions of the closed surface, different from the two first adjacent corner regions, or are arranged at the further outer edge of the closed surface which extends between the two second adjacent corner regions of the closed surface, and
    to form a second state in which an opening is provided in the housing, the first cover part and the second cover part are configured such that:
        the first cover part is rotatable in a first direction by a first definable angle about a first axis which extends along an imaginary straight line through the ends of the first edge of the first cover part so that the first cover part is rotated inwardly to be below the side of the housing,
        the second cover part is rotatable in a second direction by a second definable angle about a second axis which extends along an imaginary straight line through the ends of the first edge of the second cover part so that the second cover part is rotated inwardly to be below the side of the housing, the first edge of the second cover part is movable in a definable direction by a definable distance relative to a surface which is defined by an imaginary rectilinear connection of the four corner regions of the closed surface, and a second edge of the second cover part adjoins the first cover part, is rotatable about the second axis, and the first edge of the first cover part is closer to the second edge of the second cover part than the first edge of the second cover part.

2. The cover system as claimed in claim 1, wherein when the first cover part and the second cover part are in the first state to form the closed surface, a length of the outer edge between the two first adjacent corner regions of the closed surface is greater than a length of the further outer edge between the two second adjacent corner regions of the closed surface.

3. The cover system as claimed in claim 2, wherein the second cover part has a surface with four second cover part corner regions, the ends of the first edge of the second cover part correspond to two first adjacent corner regions of the second cover part among the four second cover part corner regions, and ends of the second edge of the second cover part correspond to two second adjacent corner regions of the second cover part among the four second cover part corner regions, different from the two first adjacent corner regions of the second cover part, and the first edge of the second cover part has a greater length than a length of the second edge of the second cover part.

4. The cover system as claimed in claim 1, wherein the first cover part has a second edge aligned with the further outer edge of the closed surface, which extends between the second two adjacent corner regions of the closed surface, and the first cover part, in a region of the second edge of the first cover part, and the second cover part, in a region of the first edge of the second cover part, are connected together so as to be rotatable about the second axis with respect to one another.

5. The cover system as claimed in claim 1, wherein at least one of the first edge of the first cover part and a second edge of the first cover part immediately adjacent to the first edge of the first cover part is connected to a border of the cover system by a flexible element, and/or at least one of the first edge of the second cover part and the second edge of the second cover part immediately adjacent to the first edge of the second cover part is connected to the first cover part by a flexible element.

6. The cover system as claimed claim 1, further comprising a wiper disposed at at least one of the first edge of the second cover part and the second edge of the second cover part.

7. A housing configured to accommodate an imaging device and an optical unit of a head-up display, the housing comprising:
  a lower portion;
  an upper portion having an opening; and
  a cover system configured to open and close the opening, the cover system comprising:
    a first cover part; and
    a second cover part, the first cover part and the second cover part are configured to adjoin one another in a first state so as to form a closed surface of the housing with four corner regions, such that a first edge of the first cover part forms an outer edge of the closed surface, and ends of the first edge of the first cover part immediately adjoin two first adjacent corner regions among the four corner regions of the closed surface, a first edge of the second cover part forms at least a part of a further outer edge of the closed surface, ends of the first edge of the second cover part either immediately adjoin two second adjacent corner regions among the four corner regions of the closed surface, different from the two first adjacent corner regions, or are arranged at the further outer edge of the closed surface which extends between the two second adjacent corner regions of the closed surface, and to form a second state to open the opening in the upper portion, the first cover part and the second cover part are configured such that:

the first cover part is rotatable in a first direction by a first definable angle about a first axis which extends along an imaginary straight line through the ends of the first edge of the first cover part so that the first cover part is rotated inwardly to be below the surface of the housing, the second cover part is rotatable in a second direction by a second definable angle about a second axis which extends along an imaginary straight line through the ends of the first edge of the second cover part so that the second cover part is rotated inwardly to be below the surface of the housing, the first edge of the second cover part is movable in a definable direction by a definable distance relative to a surface which is defined by an imaginary rectilinear connection of the four corner regions of the closed surface, and a second edge of the second cover part adjoins the first cover part, is rotatable about the second axis, and the first edge of the first cover part is closer to the second edge of the second cover part than the first edge of the second cover part.

8. The housing as claimed in claim 7, further comprising at least one of an electromotive device, an electropneumatic device, an electrohydraulic device, and a spring device configured to move at least one of the first cover part and the second cover part from the first state to the second state and/or from the second state to the first state.

9. The housing as claimed in claim 7, further comprising:

a retaining device configured to release at least one of the first cover part and the second cover part in at least one the first state and the second state; and/or at least one end-stop element for at least one of the first cover part and the second cover part.

10. The housing as claimed in claim 7, further comprising:

a combiner plate;

the imaging device including at least one of liquid crystals, light emitting diodes, organic light emitting diodes, an electroluminescent device, a field emission device, a micromirror array, and a cathode ray tube; and the optical unit including a mirror configured to project light emitted by the imaging device to the combiner plate.

11. The housing as claimed in claim 7, further comprising:
the imaging device configured to emit light; and
the optical unit including a mirror, disposed on a wall of the housing, configured to project light emitted by the imaging device onto a surface disposed remotely from the housing.

12. The housing as claimed in claim 11, wherein the imaging device is disposed between a lower surface of the lower portion of the housing and the first cover part.

13. The housing as claimed in claim 12, wherein the cover system includes a wiper configured to brush a surface of at least one of the imaging device and the optical unit to remove contaminants therefrom.

14. A motor vehicle, comprising:
a chassis;
an instrument panel;
a dashboard; and
a housing, provided in at least one of the dashboard and the instrument panel, configured to accommodate an imaging device and an optical unit of a head-up display, the housing comprising:
a cover system, comprising:
a first cover part; and
a second cover part,
the first cover part and the second cover part are configured to adjoin one another in a first state so as to form a closed surface of the housing with four corner regions, such that a first edge of the first cover part forms an outer edge of the closed surface, and ends of the first edge of the first cover part immediately adjoin two first adjacent corner regions among the four corner regions of the closed surface,
a first edge of the second cover part forms at least a part of a further outer edge of the closed surface, ends of the first edge of the second cover part either immediately adjoin two second adjacent corner regions among the four corner regions of the closed surface, different from the two first adjacent corner regions, or are arranged at the further outer edge of the closed surface which extends between the two second adjacent corner regions of the closed surface, and
to form a second state in which an opening is provided in the housing, the first cover part and the second cover part are configured such that:
the first cover part is rotatable in a first direction by a first definable angle about a first axis which extends along an imaginary straight line through the ends of the first edge of the first cover part so that the first cover part is rotated inwardly to be below the surface of the housing,
the second cover part is rotatable in a second direction by a second definable angle about a second axis which extends along an imaginary straight line through the ends of the first edge of the second cover part so that the second cover part is rotated inwardly to be below the surface of the housing,
the first edge of the second cover part is movable in a definable direction by a definable distance relative to a surface which is defined by an imaginary rectilinear connection of the four corner regions of the closed surface, and
a second edge of the second cover part adjoins the first cover part, is rotatable about the second axis, and the first edge of the first cover part is closer to the second edge of the second cover part than the first edge of the second cover part.

15. The motor vehicle as claimed in claim 14, wherein the housing further comprises at least one of an electromotive device, an electropneumatic device, and a electrohydraulic device configured to move at least one of the first cover part and the second cover part from the first state to the second state and/or from the second state to the first state.

16. The motor vehicle as claimed in claim 15, wherein
the at least one of the electromotive device, the electropneumatic device, and the electrohydraulic device is configured to move the first cover part and the second cover part from the first state to the second state when the head-up display is activated, and
the at least one of the electromotive device, the electropneumatic device, and the electrohydraulic device is configured to move the first cover part and the second cover part from the second state to the first state when the head-up display is de-activated.

17. The motor vehicle as claimed in claim 14, wherein
at least one of the first edge of the first cover part and a second edge of the first cover part immediately adjacent to the first edge of the first cover part is connected to a border of the cover system by a flexible element, and
the border of the cover system corresponds to at least one of a part of the instrument panel and a part of the dashboard.

18. The motor vehicle as claimed in claim 14, wherein the housing includes:
a pivotable combiner plate disposed on an upper portion of the housing,
the imaging device configured to emit light and disposed below the pivotable combiner plate and between a lower portion of the housing and the first cover part, and
the optical unit including a mirror configured to deflect light emitted by the imaging device to the pivotable combiner plate when the first cover part and the second cover part are in the second state.

19. The motor vehicle as claimed in claim 14, further comprising a windshield,
wherein the housing includes:
the imaging device configured to emit light and disposed between a lower portion of the housing and the first cover part, and
the optical unit including a mirror configured to deflect light emitted by the imaging device to the windshield when the first cover part and the second cover part are in the second state.

* * * * *

UNITED STATES PATENT AND TRADEMARK OFFICE
CERTIFICATE OF CORRECTION

PATENT NO.         : 10,591,727 B2
APPLICATION NO.    : 15/563373
DATED              : March 17, 2020
INVENTOR(S)        : Christian Wall Page 1 of 1

It is certified that error appears in the above-identified patent and that said Letters Patent is hereby corrected as shown below:

In the Claims

Column 13, Line 55:
In Claim 6, after "claimed" insert -- in --.

Signed and Sealed this
Nineteenth Day of May, 2020

Andrei Iancu
*Director of the United States Patent and Trademark Office*